United States Patent
Chang et al.

(10) Patent No.: US 10,254,802 B1
(45) Date of Patent: Apr. 9, 2019

(54) RETRACTABLE KEYBOARD HINGE STRUCTURE FOR MAGNETIC KEYBOARD

(71) Applicant: Dell Products L.P., Round Rock, TX (US)

(72) Inventors: Erh-Chieh Chang, Taipei (TW); Chih-Hao Chen, New Taipei (TW); Wen-Pin Huang, Taipei (TW); Yi-Ning Shen, Yunlin County (TW); Chin-Chung Wu, Taipei (TW); Kang Ming Chuang, Kaohsiung (TW)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 15/903,535

(22) Filed: Feb. 23, 2018

(51) Int. Cl.
*G06F 1/16* (2006.01)
*G06F 3/02* (2006.01)
*H03K 17/972* (2006.01)

(52) U.S. Cl.
CPC .......... *G06F 1/1662* (2013.01); *G06F 1/1666* (2013.01); *G06F 1/1681* (2013.01); *G06F 3/0202* (2013.01); *G06F 3/0221* (2013.01); *H03K 17/972* (2013.01)

(58) Field of Classification Search
CPC ..... G06F 1/1662; G06F 1/1666; G06F 3/0221
See application file for complete search history.

(56) References Cited

U.S. PATENT DOCUMENTS

| | | | | |
|---|---|---|---|---|
| 5,287,245 A | * | 2/1994 | Lucente | G06F 1/1616 292/163 |
| 5,532,904 A | * | 7/1996 | Sellers | G06F 1/1616 200/344 |
| 5,635,928 A | * | 6/1997 | Takagi | G06F 1/1616 341/22 |
| 6,314,274 B1 | * | 11/2001 | Kumagai | H04M 1/0214 361/679.13 |
| 7,187,537 B2 | * | 3/2007 | Liao | G06F 1/1616 361/679.09 |
| 7,221,561 B2 | * | 5/2007 | Pan | H01R 35/04 361/679.08 |
| 2011/0170250 A1 | * | 7/2011 | Bhutani | G06F 1/1666 361/679.2 |
| 2014/0311880 A1 | * | 10/2014 | Krumpelman | H01H 13/14 200/5 A |
| 2015/0092330 A1 | * | 4/2015 | Kershek | G06F 1/1666 361/679.09 |
| 2017/0013716 A1 | | 1/2017 | Chandra et al. | |

* cited by examiner

*Primary Examiner* — Adrian S Wilson
(74) *Attorney, Agent, or Firm* — Baker Botts L.L.P.

(57) ABSTRACT

Systems and methods are disclosed for transitioning a magnetic keyboard between retracted and extended states using a retractable keyboard hinge structure. An information handling system may include a housing having a first housing portion and a second housing portion rotatably coupled by the retractable keyboard hinge structure. The first housing portion may include a magnetic keyboard, and a sliding plate including a plurality of magnets that may be disposed underneath the magnetic keyboard. The retractable keyboard hinge structure may include a first hinge and a first cam. The first hinge and the first cam, when the first housing portion is rotated in relation to the second housing portion, may cause the sliding plate to move in a first linear direction. In response to the sliding plate moving, the plurality of magnets may cause the magnetic keyboard to move in a second linear direction perpendicular to the first linear direction.

20 Claims, 8 Drawing Sheets

RETRACTABLE KEYBOARD HINGE STRUCTURE FOR MAGNETIC KEYBOARD

BACKGROUND

Field of the Disclosure

This disclosure relates generally to information handling systems and, more particularly, to a retractable keyboard hinge structure for magnetic keyboard.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Examples of information handling systems include portable information handling systems, such as, smart phones, tablet computers, notebook computers, media players, digital cameras, 2-in-1 tablet-laptop combination computers, wireless organizers, and/or combinations thereof. A portable information handling system may generally be any device that a user may carry for handheld use and that includes a processor. Portable information handling systems may include a keyboard that may transition between a laptop mode position and a tablet mode position as the portable information handling system is adjusted between various positions by the user. Such keyboards may be magnetic keyboards, which a portable information handling system may pull down using electrical currents. Using electrical currents may require active power and relatively high voltages. Other portable information handling systems may use a link bar to lift a keyboard lattice to provide a smooth exterior surface of the keyboard in a table mode position. However, using a link bar to lift a keyboard lattice may provide a minimal or no benefit in the thickness of the portable information handling system. Thus, it may be desirable to provide a keyboard that may transition between laptop mode and tablet mode positions that may minimize the thickness of the portable information handling system without using active power as the portable information handling system is adjusted between various positions.

SUMMARY

In one aspect, a disclosed information handling system may include a housing having a first housing portion and a second housing portion that may be rotatably coupled by a first hinge assembly. The first housing portion may include a magnetic keyboard, and a sliding plate that may be disposed underneath the magnetic keyboard. The sliding plate may include a plurality of magnets. The first hinge assembly may include a first hinge coupled to the sliding plate. The first hinge may, when the first housing portion may be rotated in relation to the second housing portion, cause the sliding plate to move in a direction parallel to the magnetic keyboard. In response to the sliding plate moving in the direction parallel to the magnetic keyboard, the plurality of magnets of the sliding plate may cause the magnetic keyboard to move in direction perpendicular to the magnetic keyboard.

In any of the disclosed embodiments of the information handling system, the first hinge may include a cam mechanism including a rotating cam and a follower cam coupled to the rotating cam and the sliding plate. When the first housing portion may be rotated in relation to the second housing portion, the rotating cam may rotate and the follower cam may translate in the direction parallel to the magnetic keyboard, which may cause the sliding plate to move in the direction parallel to the magnetic keyboard.

In any of the disclosed embodiments of the information handling system, the cam mechanism may be a cylindrical cam and the follower cam may operate in a groove cut on the periphery of the rotating cam.

In any of the disclosed embodiments of the information handling system, the cam mechanism may be an end cam and the follower cam may operate in a contour cut on the end of the rotating cam.

In any of the disclosed embodiments of the information handling system, when the first housing portion and the second housing portion may be rotated to a tablet mode position, the plurality of magnets of the sliding plate may be positioned relative to the magnetic keyboard that creates a magnetic attraction between the magnets and the magnetic keyboard that may cause the magnetic keyboard to move to a retracted keyboard position.

In any of the disclosed embodiments of the information handling system, when the first housing portion and the second housing portion may be rotated to a laptop lid closed position, the plurality of magnets of the sliding plate may be positioned relative to the magnetic keyboard that creates a magnetic attraction between the magnets and the magnetic keyboard that may cause the magnetic keyboard to move to a retracted keyboard position.

In any of the disclosed embodiments of the information handling system, when the first housing portion and the second housing portion may be rotated to a laptop mode position, the plurality of magnets of the sliding plate may be positioned relative to the magnetic keyboard that creates a magnetic attraction between the magnets and the magnetic keyboard that may cause the magnetic keyboard to move to an extended keyboard position.

In any of the disclosed embodiments of the information handling system, the magnetic keyboard may include a plurality of keys, each key may include a metal arm having a first arm portion and a second arm portion, each key of the plurality of keys may correspond to a magnet of the plurality of magnets of the sliding plate. When the first housing portion and the second housing portion may be rotated to a tablet mode position, each magnet may be positioned proximately off center relative to the corresponding key that creates a magnetic attraction between the magnet and the first arm portion of the corresponding key that may cause the corresponding key to move to a retracted key position.

In any of the disclosed embodiments of the information handling system, when the sliding plate moves to a laptop mode position, each magnet may be positioned proximately centered relative to the corresponding key that creates a magnetic attraction between the magnet and the second arm portion of the corresponding key that may cause the corresponding key to move to an extended key position.

In any of the disclosed embodiments of the information handling system, the information handling system may further include a second hinge assembly coupling the first housing portion and the second housing portion. The second hinge assembly may include a second hinge that may be coupled to the sliding plate. The first hinge may cause the sliding plate to move in a first direction and the second hinge may cause the sliding plate to move in a second direction.

In another aspect, a disclosed method may include rotatably coupling, by a first hinge assembly, a first housing portion and a second housing portion of a housing of an information handling system. The first housing portion may include a magnetic keyboard and a sliding plate that may include a plurality of magnets and may be disposed underneath the magnetic keyboard. The first hinge assembly may include a first hinge coupled to a sliding plate of the first housing portion. The method may also include rotating the first housing portion in relation to the second housing portion. The method may further include when the first housing portion may be rotated in relation to the second housing portion, causing, by the first hinge, the sliding plate to move in a direction parallel to the magnetic keyboard. The method may also include in response to the sliding plate moving in the direction parallel to the magnetic keyboard, causing, by the plurality of magnets of the sliding plate, the magnetic keyboard to move in a direction perpendicular to the magnetic keyboard.

In any of the disclosed embodiments of the method, the first hinge may include a cam mechanism including a rotating cam and a follower cam coupled to the rotating cam and the sliding plate. When the first housing portion may be rotated in relation to the second housing portion, the rotating cam may rotate and the follower cam may translate in the direction parallel to the magnetic keyboard, which may cause the sliding plate to move in the direction parallel to the magnetic keyboard.

In any of the disclosed embodiments of the method, the cam mechanism may be a cylindrical cam and the follower cam may operate in a groove cut on the periphery of the rotating cam.

In any of the disclosed embodiments of the method, the cam mechanism may be an end cam and the follower cam may operate in a contour cut on the end of the rotating cam.

In any of the disclosed embodiments of the method, when the first housing portion and the second housing portion may be rotated to a tablet mode position, the plurality of magnets of the sliding plate may be positioned relative to the magnetic keyboard that may create a magnetic attraction between the magnets and the magnetic keyboard causing the magnetic keyboard to move to a retracted keyboard position.

In any of the disclosed embodiments of the method, when the first housing portion and the second housing portion may be rotated to a laptop lid closed position, the plurality of magnets of the sliding plate may be positioned relative to the magnetic keyboard that may create a magnetic attraction between the magnets and the magnetic keyboard causing the magnetic keyboard to move to a retracted keyboard position.

In any of the disclosed embodiments of the method, when the first housing portion and the second housing portion may be rotated to a laptop mode position, the plurality of magnets of the sliding plate may be positioned relative to the magnetic keyboard that may create a magnetic attraction between the magnets and the magnetic keyboard causing the magnetic keyboard to move to an extended keyboard position.

In any of the disclosed embodiments of the method, the magnetic keyboard may include a plurality of keys, each key may include a metal arm having a first arm portion and a second arm portion, each key of the plurality of keys may correspond to a magnet of the plurality of magnets of the sliding plate. When the first housing portion and the second housing portion may be rotated to a tablet mode position, each magnet may be positioned proximately off center relative to the corresponding key creating a magnetic attraction between the magnet and the first arm portion of the corresponding key causing the corresponding key to move to a retracted key position.

In any of the disclosed embodiments of the method, when the sliding plate may move to a laptop mode position, each magnet may be positioned proximately centered relative to the corresponding key creating a magnetic attraction between the magnet and the second arm portion of the corresponding key causing the corresponding key to move to an extended key position.

In any of the disclosed embodiments of the method, the method may also include rotatably coupling the first housing portion and the second housing portion with a second hinge assembly. The second hinge assembly may include a second hinge that may be coupled to the sliding plate. The first hinge may cause the sliding plate to move in a first direction and the second hinge may cause the sliding plate to move in a second direction.

BRIEF DESCRIPTION OF THE DRAWINGS

For a more complete understanding of the present invention and its features and advantages, reference is now made to the following description, taken in conjunction with the accompanying drawings, in which.

DESCRIPTION OF PARTICULAR EMBODIMENT(S)

In the following description, details are set forth by way of example to facilitate discussion of the disclosed subject matter. It should be apparent to a person of ordinary skill in the field, however, that the disclosed embodiments are exemplary and not exhaustive of all possible embodiments.

As used herein, a hyphenated form of a reference numeral refers to a specific instance of an element and the un-hyphenated form of the reference numeral refers to the collective or generic element. Thus, for example, widget "72-1" refers to an instance of a widget class, which may be referred to collectively as widgets "72" and any one of which may be referred to generically as a widget "72."

As noted previously, portable information handling systems may include a keyboard that may transition between laptop and tablet positions using electrical currents or a link bar to lift a keyboard lattice to provide a smooth exterior surface in a tablet position as the portable information handling system is adjusted between various positions by the user. Such keyboard transition mechanisms may adversely affect power, size (e.g., thickness), and usability requirements of a portable information handling system design. For example, a magnetic keyboard may require active power and relatively high voltages to transition between laptop and tablet positions. Another keyboard using a link bar to move a keyboard lattice to transition to a tablet position may provide minimal or no benefit in the thickness of the portable information handling system. As described in more detail below, a retractable keyboard hinge assembly for a magnetic keyboard may be designed to reduce the thickness of the portable information handling system and improve the usability as the housing portions are rotated between various positions and the magnetic keyboard transitions between retracted and extended states.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a PDA, a consumer electronic device, a network storage device, or another suitable device and may vary in size, shape, performance, functionality, and price. The information handling system may include memory, one or more processing resources such as a central processing unit (CPU) or hardware or software control logic. Additional components or the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include an instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory (SSD); as well as communications media such wires, optical fibers, microwaves, radio waves, and other electromagnetic and/or optical carriers; and/or any combination of the foregoing.

Particular embodiments are best understood by reference to FIGS. 1-6 wherein like numbers are used to indicate like and corresponding parts.

Figure 1:
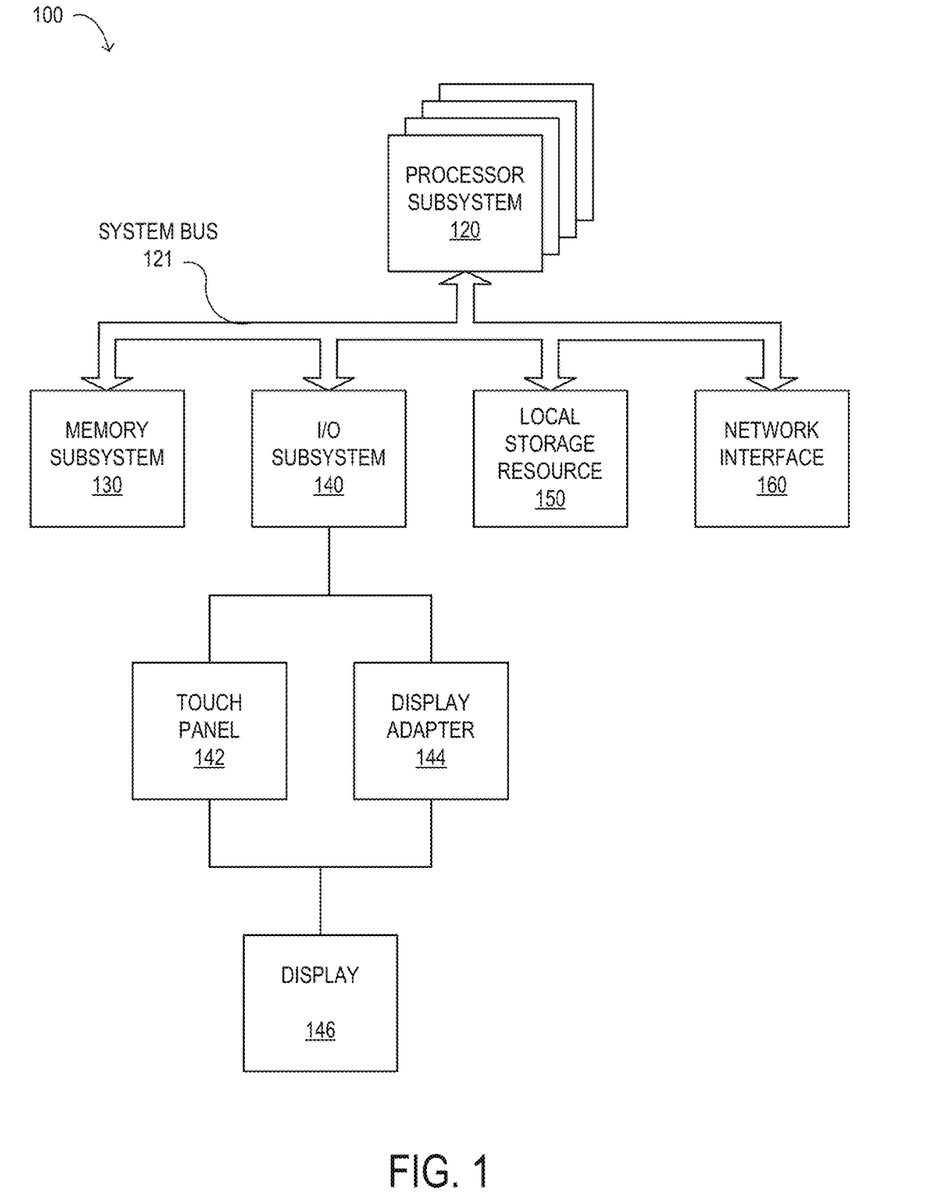
FIG. 1 is a block diagram of selected elements of an embodiment of a portable information handling system.

Turning now to the drawings, FIG. 1 illustrates a block diagram depicting selected elements of a portable information handling system 100 in accordance with some embodiments of the present disclosure. In various embodiments, portable information handling system 100 may represent different types of portable information handling systems, such as, smart phones, tablet computers, notebook computers, media players, digital cameras, 2-in-1 tablet-laptop combination computers, and wireless organizers. Components of portable information handling system 100 may include, but are not limited to, a processor subsystem 120, which may comprise one or more processors, and system bus 121 that communicatively couples various system components to processor subsystem 120 including, for example, a memory subsystem 130, an I/O subsystem 140, a local storage resource 150, and a network interface 160. System bus 121 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

In FIG. 1, network interface 160 may be a suitable system, apparatus, or device operable to serve as an interface between information handling system 100 and a network. Network interface 160 may enable information handling system 100 to communicate over the network using a suitable transmission protocol and/or standard, including, but not limited to, transmission protocols and/or standards enumerated below with respect to the discussion of the network. In some embodiments, network interface 160 may be communicatively coupled via the network to a network storage resource. The network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and/or messages (generally referred to as data). The network may transmit data using a desired storage and/or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. The network and its various components may be implemented using hardware, software, or any combination thereof.

As depicted in FIG. 1, processor subsystem 120 may comprise a system, device, or apparatus operable to interpret and/or execute program instructions and/or process data, and may include a microprocessor, microcontroller, digital signal processor (DSP), application specific integrated circuit (ASIC), or another digital or analog circuitry configured to interpret and/or execute program instructions and/or process data. In some embodiments, processor subsystem 120 may interpret and/or execute program instructions and/or process data stored locally (e.g., in memory subsystem 130 and/or another component of information handling system). In the same or alternative embodiments, processor subsystem 120 may interpret and/or execute program instructions and/or process data stored remotely (e.g., in a network storage resource, not shown).

Also in FIG. 1, memory subsystem 130 may comprise a system, device, or apparatus operable to retain and/or retrieve program instructions and/or data for a period of time (e.g., computer-readable media). Memory subsystem 130 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as system 100, is powered down.

In portable information handling system 100, I/O subsystem 140 may comprise a system, device, or apparatus generally operable to receive and/or transmit data to/from/within portable information handling system 100. I/O subsystem 140 may represent, for example, a variety of communication interfaces, graphics interfaces, video interfaces, user input interfaces, and/or peripheral interfaces. As shown, I/O subsystem 140 may comprise touch panel 142 and display adapter 144. Touch panel 142 may include circuitry for enabling touch functionality in conjunction with display 146 that is driven by display adapter 144.

Local storage resource 150 may comprise computer-readable media (e.g., hard disk drive, floppy disk drive, CD-ROM, and/or other type of rotating storage media, flash memory, EEPROM, and/or another type of solid state storage media) and may be generally operable to store instructions and/or data. Likewise, the network storage resource may comprise computer-readable media (e.g., hard disk drive, floppy disk drive, CD-ROM, and/or other type of rotating storage media, flash memory, EEPROM, and/or other type of solid state storage media) and may be generally operable to store instructions and/or data. In system 100, I/O subsystem 140 may comprise a system, device, or apparatus generally operable to receive and/or transmit data to/from/within system 100. In addition to local storage resources 150, in some embodiments, portable information handling system 100 may communicatively couple via network 165 to a network storage resource (not shown) using network interface 160 discussed below.

Network interface 160 may be a suitable system, apparatus, or device operable to serve as an interface between portable information handling system 100 and network 165. Network interface 160 may enable portable information handling system 100 to communicate over a network using any suitable transmission protocol and/or standard, including, but not limited to various transmission protocols and/or standards. The network coupled to network interface 160 may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and/or messages (generally referred to as data or information). In some embodiments, the network communicatively coupled to network interface 160 may transmit data using a desired storage and/or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. The network, network interface 160, and/or various components associated therewith may be implemented using hardware, software, or any combination thereof. Network interface 160 may enable wired and/or wireless communications to and/or from portable information handling system 100.

Figure 2:
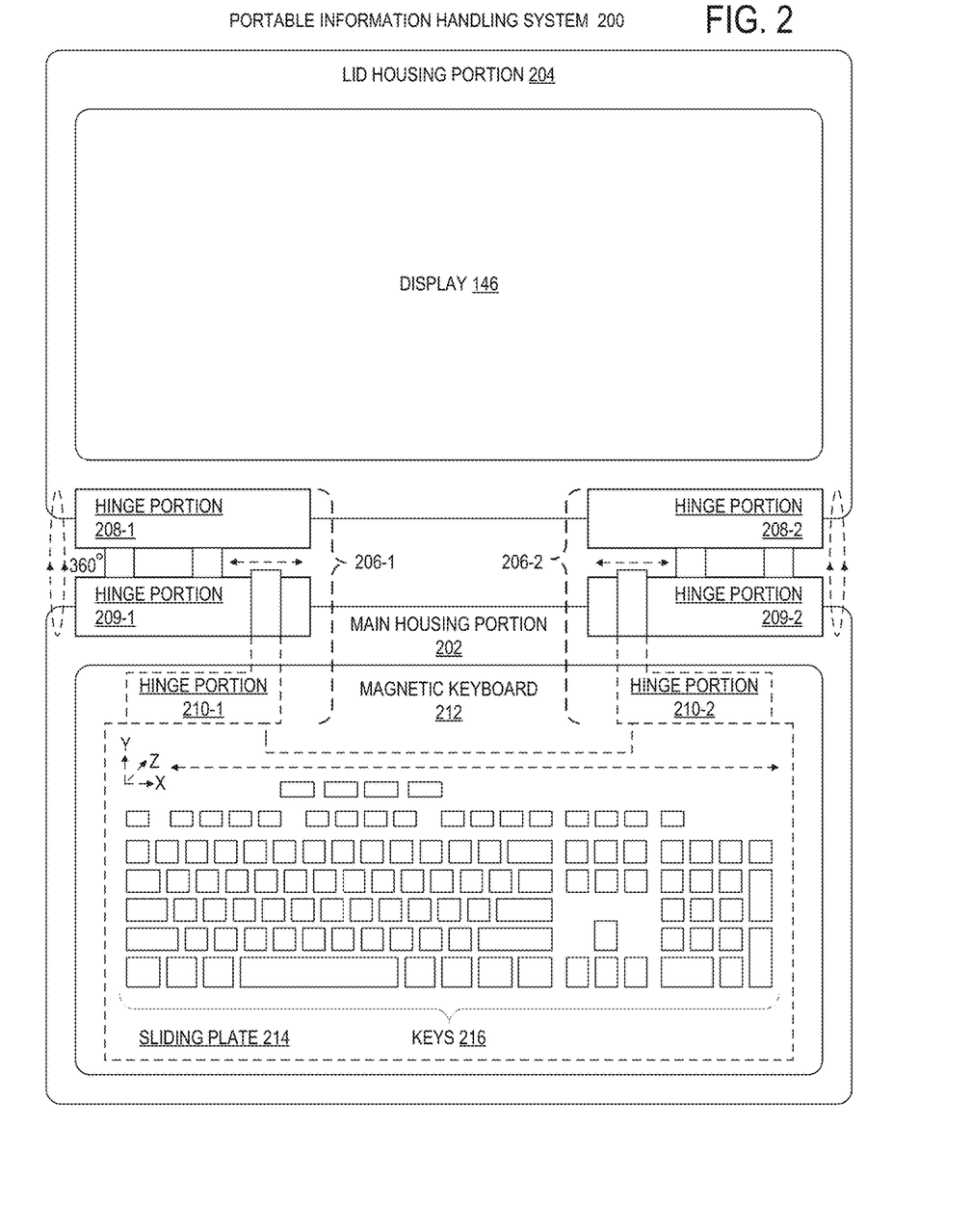
FIG. 2 is a block diagram of a portable information handling system having a retractable keyboard hinge structure and magnetic keyboard.

Turning now to FIG. 2, is a block diagram of a portable information handling system 200 having hinge assemblies 206, also referred herein as retractable keyboard hinge assemblies 206. Portable information handling system 200 may further include a housing having a main housing portion 202 rotatably coupled to a lid housing portion 204 to support various configurations to interact with an end user. More specifically, main housing portion 202 couples to lid housing portion 204 via hinge assemblies 206 such that a user may rotate main housing portion 202 and/or lid housing portion 204 relative to each other. Main housing portion 202 and lid housing portion 204 may hold one or more components of portable information handling system 200, including but not limited to processor subsystem 120, system bus 121, memory subsystem 130, I/O subsystem 140, local storage resource 150, network interface 160, touch panel 142, display adapter 144, and display 146 discussed above with respect to FIG. 1. Main housing portion 202 may also include a magnetic keyboard 212 that may be disposed on a top portion of main housing portion 202 and a sliding plate 214 that may be disposed underneath magnetic keyboard 212. Magnetic keyboard 212 may include a plurality of keys 216. Sliding plate 214 may include a plurality of magnets.

Hinge assembly 206-1 may include a hinge portion 208-1 coupled to lid housing portion 204, hinge portion 209-1 coupled to hinge portion 208-1 and main housing portion 202, and hinge portion 210-1 coupled to hinge portion 209-1 and sliding plate 214. Hinge assembly 206-2 may include a hinge portion 208-2 coupled to lid housing portion 204, hinge portion 209-2 coupled to hinge portion 208-2 and main housing portion 202, and hinge portion 210-2 coupled to hinge portion 209-2 and sliding plate 214. Hinge assemblies 206 may rotate between 0° and 360° in both directions as main housing portion 202 and lid housing portion 204 are rotated in relation to each other between 0° and 360°.

As explained below in further detail, hinge assemblies 206 allow main housing portion 202 and lid housing portion 204 to rotate between a plurality of positions. For example, when portable information handling system 200 is not in use, lid housing portion 204 may be closed over the top of main housing portion 202 so that display 146 is protected from unintended use or damage. Hinge assemblies 206 may, when main housing portion 202 may be rotated in relation to lid housing portion 204, cause sliding plate 214 to move along a coplanar line (e.g., a line on an x-axis). In response to sliding plate 214 moving along the coplanar line, the plurality of magnets of sliding plate 214 may cause the keys 216 of magnetic keyboard 212 to move along a vertical line perpendicular to the coplanar line (e.g., a line on a y-axis) between a retracted keyboard position and an extended keyboard position. The coplanar line may be parallel to magnetic keyboard 212 and the vertical line may be perpendicular to magnetic keyboard 212.

Hinge assemblies 206 may, when main housing portion 202 may be rotated in relation to lid housing portion 204 to a tablet mode position, the plurality of magnets of sliding plate 214 may be positioned relative to magnetic keyboard 212 that may create a magnetic attraction between the magnets and the keys 216 of magnetic keyboard 212. The magnetic attraction between the magnets and the keys 216 of magnetic keyboard 212 may cause magnetic keyboard 212 to move to a retracted keyboard position. When portable information handling system 200 is in the tablet mode position, a user may provide input to portable information handling system 200 through display 146 to touch panel 142. The tablet mode position may be when the angle of rotation of main housing portion 202 and lid housing portion 204 is between 181° and 360°.

Hinge assemblies 206 may, when main housing portion 202 may be rotated in relation to lid housing portion 204 to a laptop lid closed position, the plurality of magnets of sliding plate 214 may be positioned relative to magnetic keyboard 212 that may create a magnetic attraction between the magnets and the keys 216 of magnetic keyboard 212. The magnetic attraction between the magnets and the keys 216 of magnetic keyboard 212 may cause magnetic keyboard 212 to move to a retracted keyboard position. The laptop lid closed position may be when the angle of rotation of main housing portion 202 and lid housing portion 204 is between 89° and 0°.

Hinge assemblies 206 may, when main housing portion 202 may be rotated in relation to lid housing portion 204 to a laptop mode position, the plurality of magnets of sliding plate 214 may be positioned relative to magnetic keyboard 212 to create a magnetic attraction between the magnets and the keys 216 of magnetic keyboard 212 that may cause magnetic keyboard 212 to move to an extended keyboard position. When portable information handling system 200 is in the laptop mode position, a user may provide input to portable information handling system 200 using keys 216 of magnetic keyboard 212.

Figure 3A:
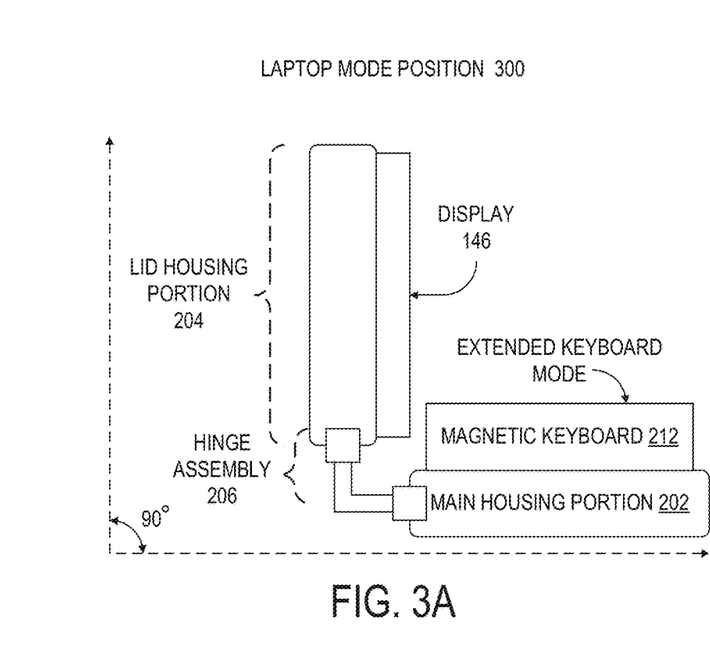
FIGS. 3A, 3B, and 3C are block diagrams of selected elements of embodiments of a portable information handling system in multiple positions.
Figure 3B:
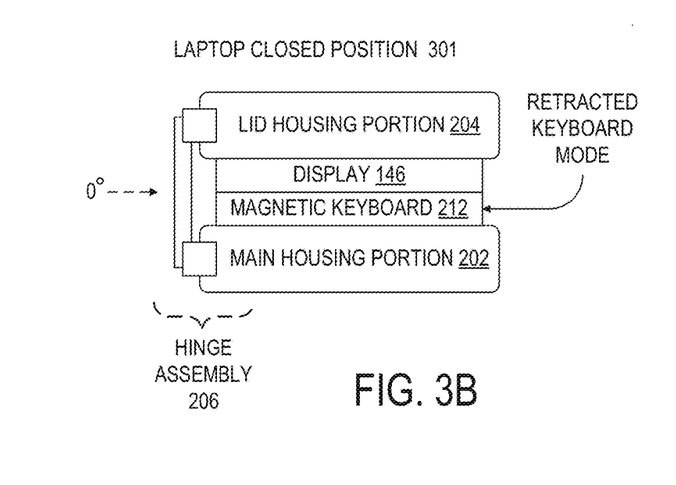
Figure 3C:
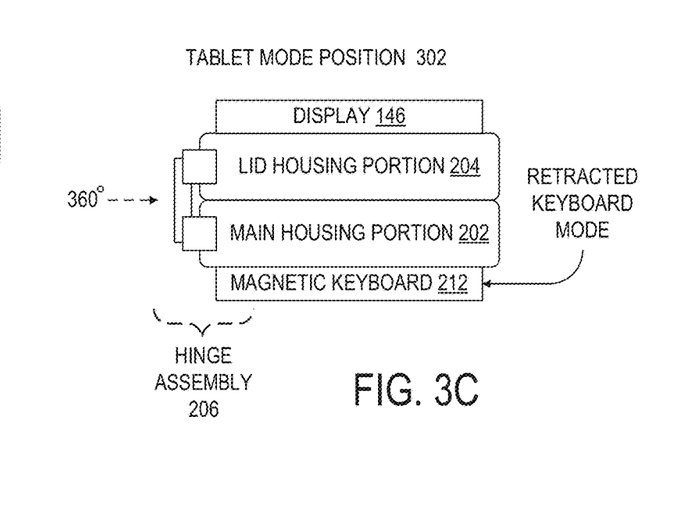

FIGS. 3A, 3B, and 3C are side views of selected elements of embodiments of a portable information handling system in multiple positions including laptop mode, tablet mode, and laptop closed positions. The portable information handling system includes a main housing portion 202 having a magnetic keyboard 212, a lid housing position 204 having a display 146, and a hinge assembly 206 previously described with reference to FIG. 2. In FIG. 3A, a portable information handling system is shown in a laptop mode position 300. In laptop mode position 300, main housing portion 202 may be rotated to an angle of approximately 90 degrees in relation to lid housing portion 204. In laptop mode position 300, display 146 is shown in a nearly vertical position for viewing and interacting by a user and magnetic keyboard 212 is shown in an extended keyboard mode. In FIG. 3B, a portable information handling system is shown in a laptop closed position 301. In laptop closed position 301, main housing portion 202 may be rotated to an angle of approximately 0 degree in relation to lid housing portion 204. In laptop closed position 301, display 146 is shown facing magnetic keyboard 212 in a protected position and magnetic keyboard 212 is shown in a retracted keyboard mode. In FIG. 3C, a portable information handling system is shown in a tablet mode position 302. In tablet mode position 302, main housing portion 202 may be rotated to an angle of approximately 360 degree in relation to lid housing portion 204. In tablet mode position 302, display 146 is shown in a nearly horizontal position for viewing and interacting by a user and magnetic keyboard 212 is in a retracted keyboard mode.

Figure 4:
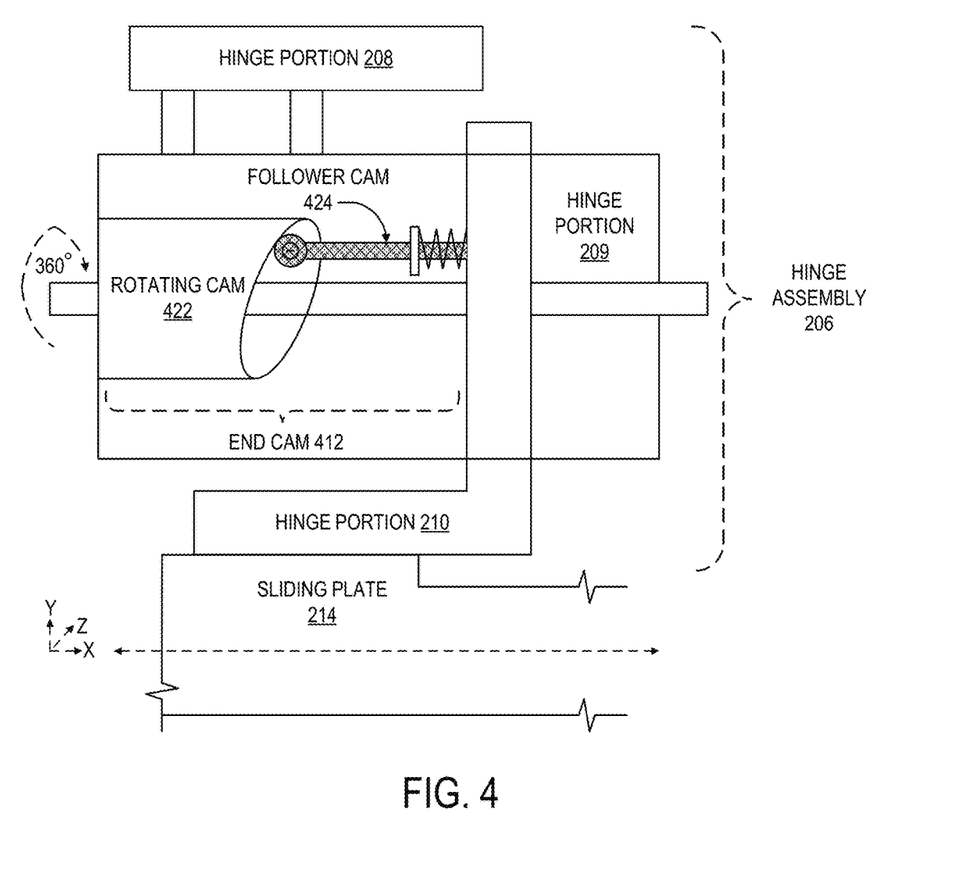
FIG. 4 is a block diagram of selected elements of an embodiment of a retractable keyboard hinge structure.

Turning now to FIG. 4, is a block diagram of hinge assembly 206 coupled to sliding plate 214. Hinge portion 209 of hinge assembly 206 may include an end cam 412 that may include a rotating cam 422 and a follower cam 424. Rotating cam 422 of end cam 412 may have a rotating portion, a first end, and a contour portion along a second end of rotating cam 422. Follower cam 424 may include a first end having a roller and a second end having a spring. The roller of follower cam 424 may be coupled to the contour portion of rotating cam 422 and the second end of follower cam 424 and one end of the spring of the second end may be coupled to hinge portion 210. When main housing portion 202 may be rotated in relation to lid housing portion 204, the rotating portion of rotating cam 422 may rotate and the roller of follower cam 424 may move along the contour portion of rotating cam 422. As the roller of follower cam 424 moves along the contour portion of rotating cam 422, follower cam 424 moves or translates along a coplanar line, which may cause hinge portion 210 and sliding plate 214 to move along the coplanar line.

Figure 5:
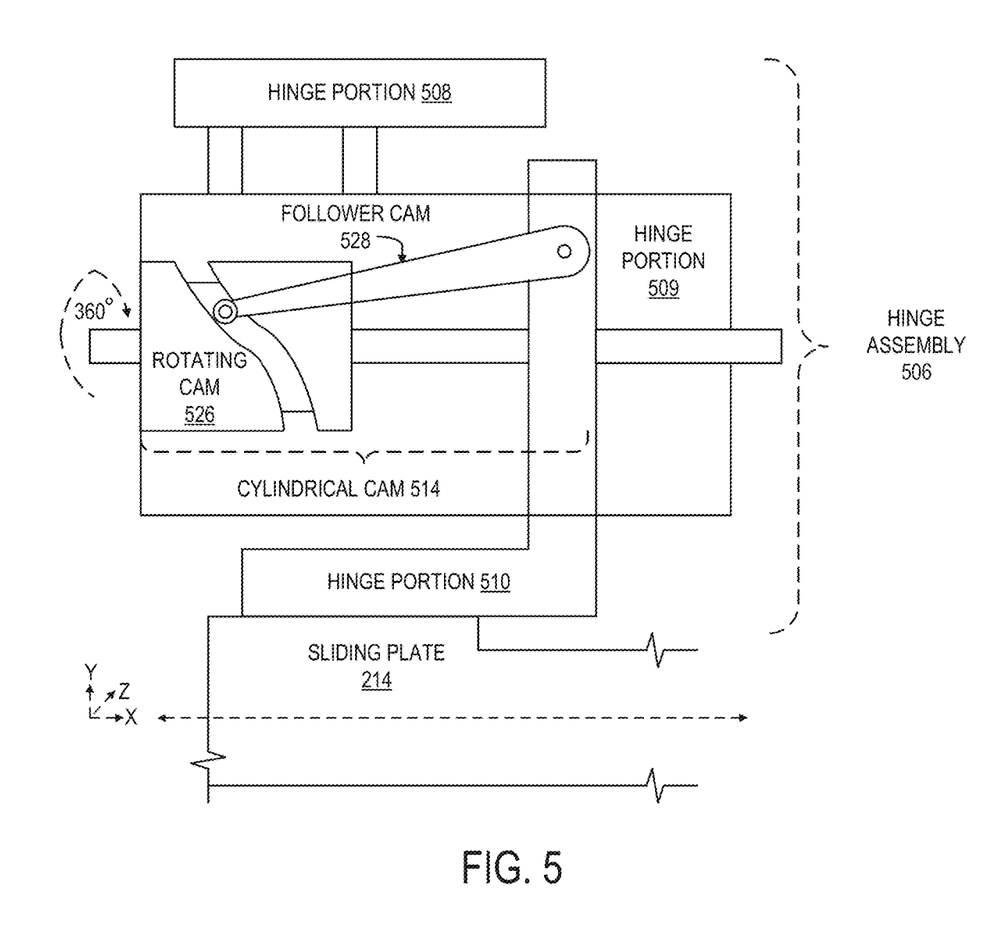
FIG. 5 is a block diagram of selected elements of an embodiment of a retractable keyboard hinge structure.

Turning now to FIG. 5, is a block diagram of a hinge assembly 506 coupled to sliding plate 214. Hinge assembly 506 may include hinge portion 508, a hinge portion 509, and a hinge portion 510. Hinge portion 508 is coupled to hinge portion 510 by hinge portion 509. Hinge portion 509 of hinge assembly 506 may include a cylindrical cam 514 having a rotating cam 526 and a follower cam 528. Rotating cam 526 of cylindrical cam 514 may have a rotating portion and a groove cut on the periphery of rotating cam 526. Follower cam 528 may include a first end having a roller and a second end. The roller of follower cam 528 may be coupled to the groove of rotating cam 526 and the second end of follower cam 528 may be coupled to hinge portion 510. When main housing portion 202 may be rotated in relation to lid housing portion 204, the rotating portion of rotating cam 526 may rotate and the roller of follower cam 528 may move along the groove of rotating cam 526. As the roller of follower cam 528 moves along the groove of rotating cam 526, follower cam 528 moves or translates along a coplanar line, which may cause hinge portion 510 and sliding plate 214 to move along the coplanar line.

Figure 6A:
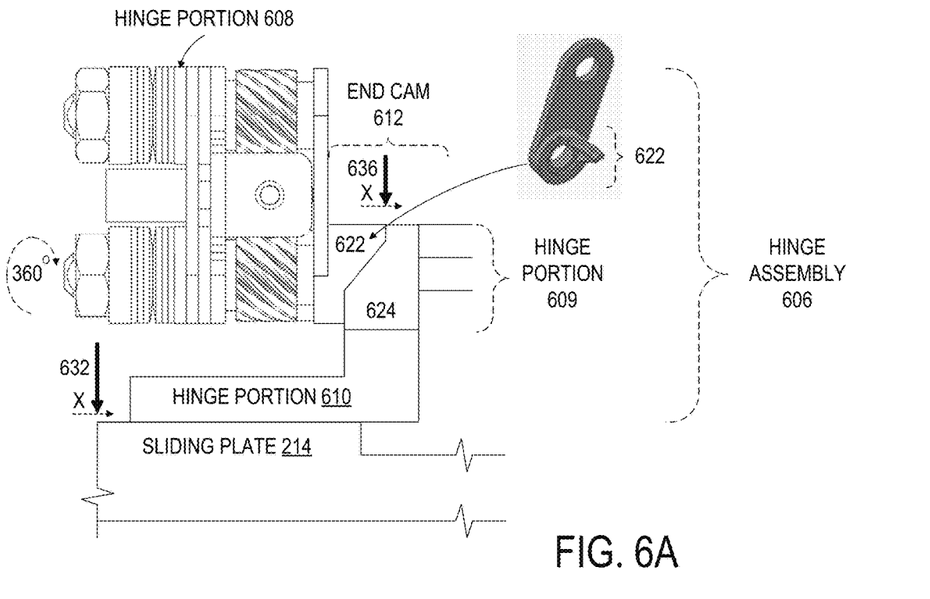
FIGS. 6A and 6B are top views including selected elements of an embodiment of a retractable keyboard hinge structure in various positions.
Figure 6B:
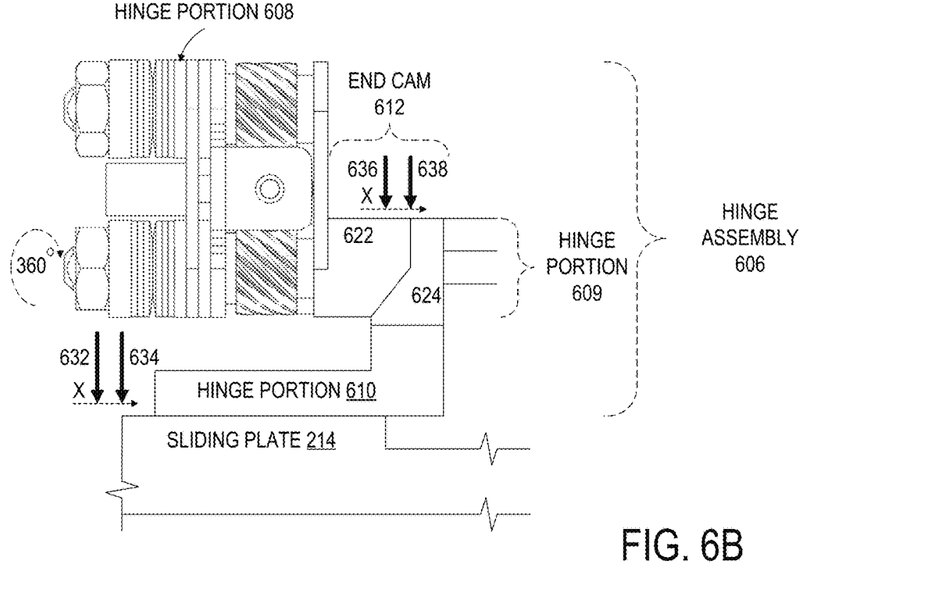

FIGS. 6A and 6B illustrate top views including selected elements of an embodiment of a retractable keyboard hinge structure in various positions. As shown in FIGS. 6A and 6B, a hinge assembly 606 is coupled to sliding plate 214. Hinge assembly 606 may include a hinge portion 608, a hinge portion 609, and a hinge portion 610. Hinge portion 608 is coupled to hinge portion 610 by hinge portion 609. Hinge portion 609 of hinge assembly 606 may include an end cam 612 that may include a rotating cam 622 and a follower cam 624. As depicted in FIGS. 6A and 6B, rotating cam 622 of end cam 612 may have a rotating portion, a first end, and a contour portion along a second end of rotating cam 622. Follower cam 624 may include a first end and a second end. The first end of follower cam 624 may be movably coupled to the contour portion of the second end of rotating cam 622 such that follower cam 624 may move along a coplanar line when the rotating portion of rotating cam 622 rotates. The second end of follower cam 624 may be coupled to hinge portion 610. As depicted in FIG. 6A, sliding plate 214 is at a linear position 632 of a first coplanar line and follower cam 624 is at a linear position 636 of a second coplanar line parallel to the first coplanar line. As shown in FIG. 6B, when main housing portion 202 is rotated in relation to lid housing portion 204, the rotating portion of rotating cam 622 may rotate and the follower cam 624 may move or translate along the second coplanar line from the linear position 636 to a linear position 638, which may cause hinge portion 610 and sliding plate 214 to move or translate along the first coplanar line from the linear position 632 to a linear position 634.

Figure 7A:
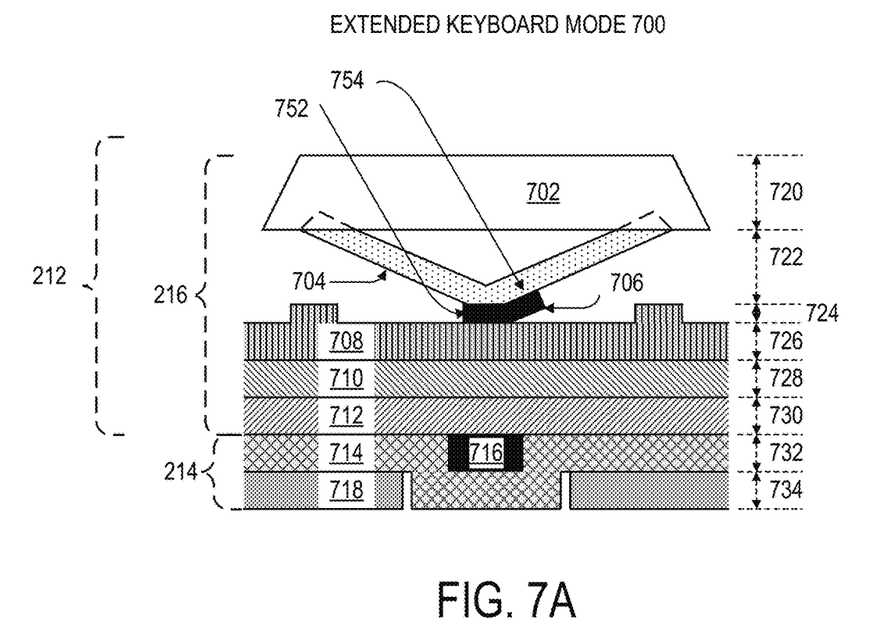
FIGS. 7A and 7B are block diagrams of selected elements of embodiments of a key of a magnetic keyboard in extended keyboard and retracted keyboard modes.
Figure 7B:
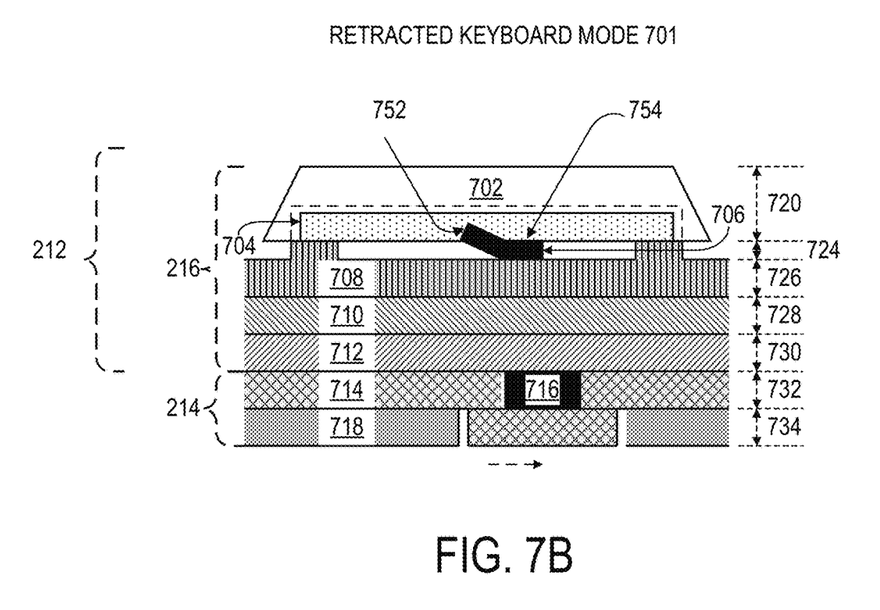

FIGS. 7A and 7B, are front views of one key 216 of the plurality of keys 216 of magnetic keyboard 212 and portions of sliding plate 214 disposed underneath key 216. Although only one key 216 is shown, it is understood that the structure of key 216 is the same structure of every key 216 of magnetic keyboard 212 and that the structure of the portions of sliding plate 214 disposed underneath key 216 is the same structure disposed underneath every key 216 of magnetic keyboard 212. Sliding plate 214 may be coupled to hinge portion 210 and when hinge portion 210 is moved using one of the cam mechanisms of FIGS. 4, 5, 6A, and 6B, sliding plate 214 is moved under all the keys 206 and each key 206 is actuated as shown in FIGS. 7A and 7B.

In FIG. 7A, key 216 is shown in an extended keyboard mode 700, also referred herein as usage mode. Key 216 may include a keycap 702, scissors 704, a metal arm 706 having an arm portion 752 and an arm portion 754, a plunger sheet 708, a membrane 710, and a base plate 712. Sliding plate 214 may include magnet support plate 714, a magnet 716 corresponding to key 216, and a backlight module 718. When magnet 716 may be positioned proximately centered relative to key 216, a magnetic attraction between magnet 716 and arm portion 752 may cause key 216 to actuate and move to the extended key position.

When key 216 is in extended keyboard mode, a total height of key 216 and sliding plate 214 in the vertical direction may be given by the sum of a keycap height 720 of keycap 702, a travel height 722 measured between the bottom of keycap 702 and plunger sheet 708, a plunger sheet height 726 of plunger sheet 708, a membrane height 728 of membrane 710, a base plate height 730 of base plate 712, a magnet support plate height 732 of magnet support plate 714, and a backlight module height 734 of backlight module 718. Also shown is an air gap height 724 of a protrusion of plunger sheet 708. For example, keycap height 720 may be 1.9 mm, travel height 722 may be 1.7 mm, plunger sheet height 726 may be 0.15 mm, membrane height 728 may be 0.25 mm, base plate height 730 may be 0.2 mm, magnet support plate height 732 may be 0.6 mm including a metal plate height of 0.2 mm and a bump out height of 0.4 mm, backlight module height 734 may be 0.4 mm, and air gap height 724 may be 0.2 mm, which results in a total height of key 216 and sliding plate 214 of 5.0 mm.

In FIG. 7B, key 216 is shown in a retracted keyboard mode 701, also referred herein as storage mode. When magnet 716 may be positioned proximately off center relative to key 216, a magnetic attraction between magnet 716 and arm portion 754 may cause key 216 to actuate to the retracted key position.

When key 216 is in retracted keyboard mode, the travel height 722 measured between the bottom of keycap 702 and plunger sheet 708 may be eliminated. For example, when key 216 is in retracted keyboard mode, travel height 722 of 1.7 mm in extended keyboard mode may be reduced to 0 mm, which results in a total height of key 216 and sliding plate 214 of 3.3 mm and a total height reduction of 1.7 mm.

Figure 8:
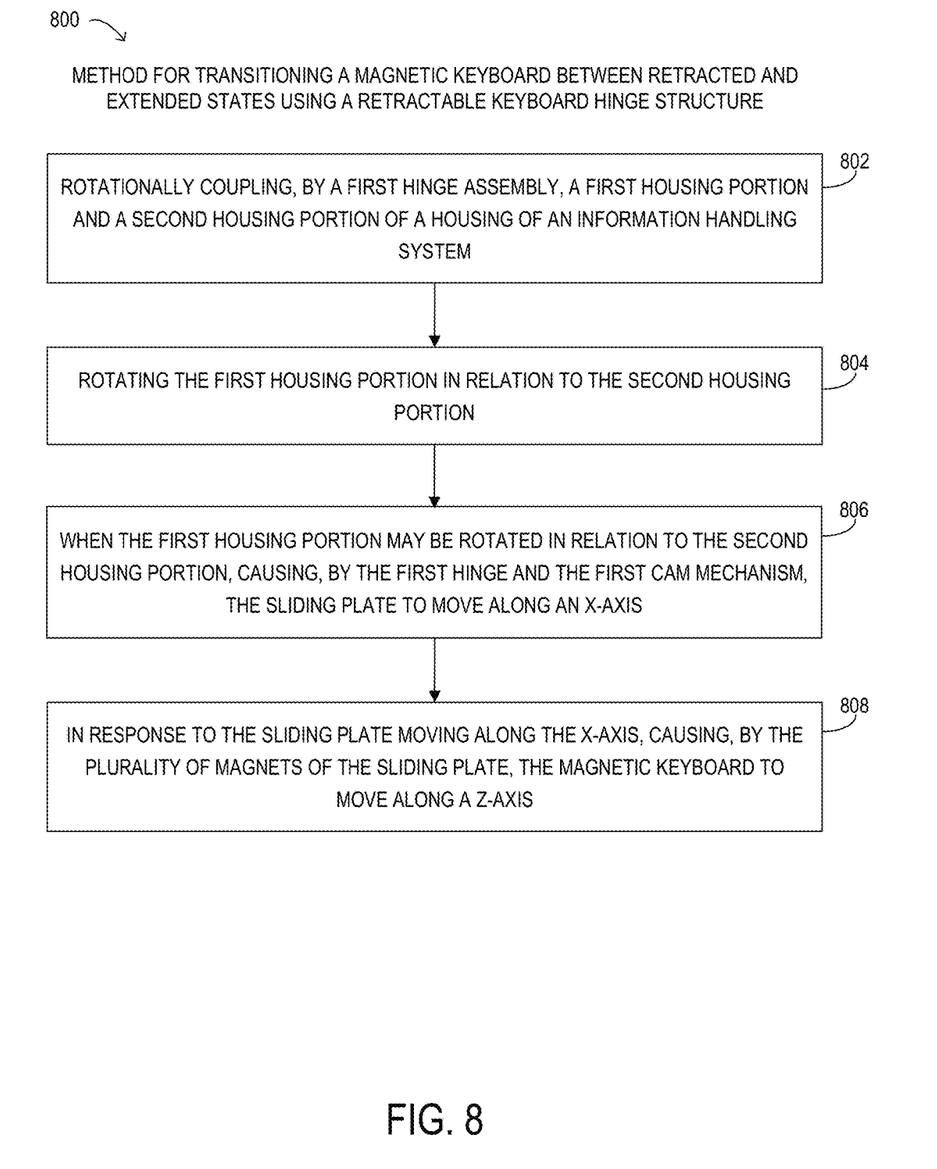
FIG. 8 is flowchart depicting selected elements of an embodiment of a method for transitioning a magnetic keyboard between retracted and extended states using a retractable keyboard hinge structure.

FIG. 8 is flowchart depicting selected elements of an embodiment of a method for transitioning a magnetic keyboard between retracted and extended keyboard modes using a retractable keyboard hinge structure. It is noted that certain operations described in method 800 may be optional or may be rearranged in different embodiments.

Method 800 may begin at step 802, by rotatably coupling, by a first hinge assembly, a first housing portion and a second housing portion of a housing of an information handling system. The first housing portion may include a magnetic keyboard and a sliding plate that may include a plurality of magnets and may be disposed underneath the magnetic keyboard. The first hinge assembly may include a first hinge coupled to the sliding plate of the first housing portion. The first hinge assembly may permit the housing portions to rotate to different positions relative to each other, including for example, a tablet mode position, a laptop mode position, and a laptop closed position discussed above with respect to FIGS. 3A, 3B, and 3C. At step 804, rotating the first housing portion in relation to the second housing portion. At step 806, when the first housing portion may be rotated in relation to the second housing portion, causing, by the first hinge, the sliding plate to move in a direction parallel to the magnetic keyboard. At step 808, in response to the sliding plate moving in the direction parallel to the magnetic keyboard, causing, by the plurality of magnets of the sliding plate, the magnetic keyboard to move in a direction perpendicular to the magnetic keyboard. After step 808, method 800 may end.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. An information handling system, comprising:
   a housing having a first housing portion and a second housing portion rotatably coupled by a first hinge assembly,
   the first housing portion including:
      a magnetic keyboard; and
      a sliding plate disposed underneath the magnetic keyboard, the sliding plate including a plurality of magnets, and
   the first hinge assembly including a first hinge coupled to the sliding plate, the first hinge to:
      when the first housing portion is rotated in relation to the second housing portion, cause the sliding plate to move in a direction parallel to the magnetic keyboard; and
      in response to the sliding plate moving in the direction parallel to the magnetic keyboard, the plurality of magnets of the sliding plate cause the magnetic keyboard to move in a direction perpendicular to the magnetic keyboard.

2. The information handling system of claim 1, wherein the first hinge comprises a cam mechanism including a rotating cam and a follower cam coupled to the rotating cam and the sliding plate, and when the first housing portion is rotated in relation to the second housing portion, the rotating cam rotates and the follower cam translates in the direction parallel to the magnetic keyboard, which causes the sliding plate to move in the direction parallel to the magnetic keyboard.

3. The information handling system of claim 2, wherein the cam mechanism is a cylindrical cam and the follower cam operates in a groove cut on the periphery of the rotating cam.

4. The information handling system of claim 2, wherein the cam mechanism is an end cam and the follower cam operates in a contour cut on the end of the rotating cam.

5. The information handling system of claim 1, wherein when the first housing portion and the second housing portion are rotated to a tablet mode position, the plurality of magnets of the sliding plate are positioned relative to the magnetic keyboard that creates a magnetic attraction between the magnets and the magnetic keyboard that causes the magnetic keyboard to move to a retracted keyboard position.

6. The information handling system of claim 1, wherein when the first housing portion and the second housing portion are rotated to a laptop lid closed position, the plurality of magnets of the sliding plate are positioned relative to the magnetic keyboard that creates a magnetic attraction between the magnets and the magnetic keyboard that causes the magnetic keyboard to move to a retracted keyboard position.

7. The information handling system of claim 1, wherein when the first housing portion and the second housing portion are rotated to a laptop mode position, the plurality of magnets of the sliding plate are positioned relative to the magnetic keyboard that creates a magnetic attraction between the magnets and the magnetic keyboard that causes the magnetic keyboard to move to an extended keyboard position.

8. The information handling system of claim 1, the magnetic keyboard comprising a plurality of keys, each key including a metal arm having a first arm portion and a second arm portion, each key of the plurality of keys corresponding to a magnet of the plurality of magnets of the sliding plate, wherein when the first housing portion and the second housing portion are rotated to a tablet mode position, each magnet is positioned proximately off center relative to the corresponding key that creates a magnetic attraction between the magnet and the first arm portion of the corresponding key that causes the corresponding key to move to a retracted key position.

9. The information handling system of claim 8, wherein when the sliding plate moves to a laptop mode position, each magnet is positioned proximately centered relative to the corresponding key that creates a magnetic attraction between the magnet and the second arm portion of the corresponding key that causes the corresponding key to move to an extended key position.

10. The information handling system of claim 1, further comprising:
a second hinge assembly coupling the first housing portion and the second housing portion, the second hinge assembly comprising a second hinge coupled to the sliding plate, wherein the first hinge causes the sliding plate to move in a first direction and the second hinge causes the sliding plate to move in a second direction.

11. A method, comprising:
rotatably coupling, by a first hinge assembly, a first housing portion and a second housing portion of a housing of an information handling system,
wherein the first housing portion including:
a magnetic keyboard; and
a sliding plate including a plurality of magnets and disposed underneath the magnetic keyboard, and
wherein the first hinge assembly comprising a first hinge coupled to a sliding plate of the first housing portion;
rotating the first housing portion in relation to the second housing portion;
when the first housing portion is rotated in relation to the second housing portion, causing, by the first hinge, the sliding plate to move in a direction parallel to the magnetic keyboard; and
in response to the sliding plate moving in the direction parallel to the magnetic keyboard, causing, by the plurality of magnets of the sliding plate, the magnetic keyboard to move in a direction perpendicular to the magnetic keyboard.

12. The method of claim 11, wherein the first hinge comprises a cam mechanism including a rotating cam and a follower cam coupled to the rotating cam and the sliding plate, and wherein when the first housing portion is rotating in relation to the second housing portion, the rotating cam rotates and the follower cam translates in the direction parallel to the magnetic keyboard, causing the sliding plate to move in the direction parallel to the magnetic keyboard.

13. The method of claim 12, wherein the cam mechanism is a cylindrical cam and the follower cam operates in a groove cut on the periphery of the rotating cam.

14. The method of claim 12, wherein the cam mechanism is an end cam and the follower cam operates in a contour cut on the end of the rotating cam.

15. The method of claim 11, wherein when the first housing portion and the second housing portion are rotated to a tablet mode position, the plurality of magnets of the sliding plate are positioned relative to the magnetic keyboard creating a magnetic attraction between the magnets and the magnetic keyboard causing the magnetic keyboard to move to a retracted keyboard position.

16. The method of claim 11, wherein when the first housing portion and the second housing portion are rotated to a laptop lid closed position, the plurality of magnets of the sliding plate are positioned relative to the magnetic keyboard creating a magnetic attraction between the magnets and the magnetic keyboard causing the magnetic keyboard to move to a retracted keyboard position.

17. The method of claim 11, wherein when the first housing portion and the second housing portion are rotated to a laptop mode position, the plurality of magnets of the sliding plate are positioned relative to the magnetic keyboard creating a magnetic attraction between the magnets and the magnetic keyboard causing the magnetic keyboard to move to an extended keyboard position.

18. The method of claim 11, wherein the magnetic keyboard comprising a plurality of keys, each key including a metal arm having a first arm portion and a second arm portion, each key of the plurality of keys corresponding to a magnet of the plurality of magnets of the sliding plate, and when the first housing portion and the second housing portion are rotated to a tablet mode position, each magnet is positioned proximately off center relative to the corresponding key creating a magnetic attraction between the magnet and the first arm portion of the corresponding key causing the corresponding key to move to a retracted key position.

19. The method of claim 18, wherein when the sliding plate moves to a laptop mode position, each magnet is positioned proximately centered relative to the corresponding key creating a magnetic attraction between the magnet and the second arm portion of the corresponding key causing the corresponding key to move to an extended key position.

20. The method of claim 11, further comprising:
rotatably coupling the first housing portion and the second housing portion with a second hinge assembly comprising a second hinge coupled to the sliding plate, wherein the first hinge causes the sliding plate to move in a first direction and the second hinge causes the sliding plate to move in a second direction.

* * * * *